United States Patent [19]

Stein

[11] 4,389,579
[45] Jun. 21, 1983

[54] SAMPLE AND HOLD CIRCUIT

[75] Inventor: Marc T. Stein, Tempe, Ariz.

[73] Assignee: Motorola, Inc., Schaumburg, Ill.

[21] Appl. No.: 238,729

[22] Filed: Feb. 27, 1981

Related U.S. Application Data

[63] Continuation of Ser. No. 11,733, Feb. 13, 1979, abandoned.

[51] Int. Cl.³ .................... H03K 5/03; G01R 19/04; G11C 27/02
[52] U.S. Cl. .................................. 307/353; 307/351; 307/359
[58] Field of Search ............... 307/353, 352, 359, 351; 328/151

[56] References Cited

U.S. PATENT DOCUMENTS

| 3,309,618 | 3/1967 | Harris et al. | 307/353 |
| 3,702,942 | 11/1972 | Aguirre | 307/352 |
| 4,163,909 | 8/1979 | Harr | 307/351 |

Primary Examiner—John Zazworsky
Attorney, Agent, or Firm—Michael D. Bingham

[57] ABSTRACT

A sample and hold circuit for producing an output voltage the magnitude of which is representative of the peak magnitude of a sampled input signal. The sample and hold circuit comprises a unity gain amplifier having an input terminal to receive said input signal and a cascoded output section for sourcing current at an output terminal. A discharge circuit is provided which includes a cascoded section for sinking current at said output terminal. Each of said cascoded sections being coupled to a capacitive load for charging or discharging the capacitor respectively to provide said output voltage.

12 Claims, 1 Drawing Figure

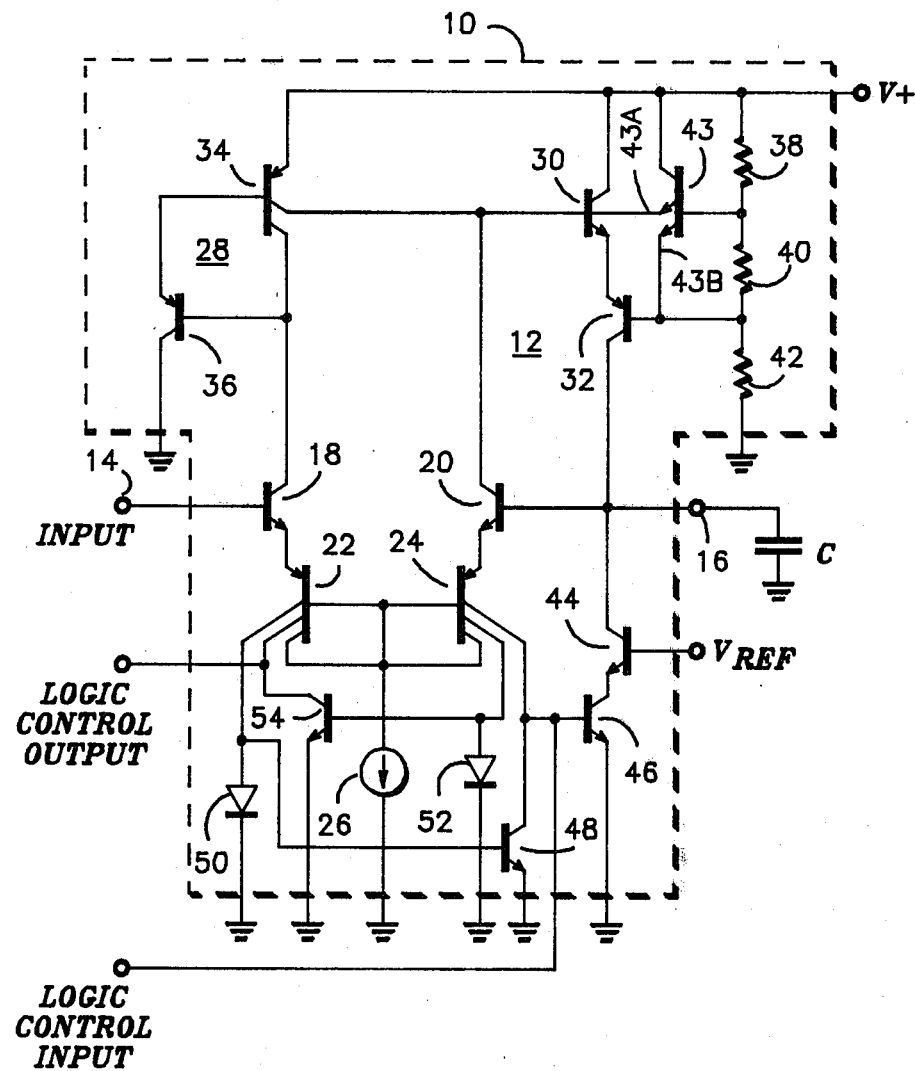

SAMPLE AND HOLD CIRCUIT

This is a continuation of application Ser. No. 11,733, filed Feb. 13, 1979, now abandoned.

BACKGROUND OF THE INVENTION

1. Field of the Invention

This invention relates to an interfacing circuit and more particularly to an electronic sample and hold circuit for providing an output analog voltage representative of the peak magnitude of a sampled input signal.

2. Description of the Prior Art

Sample and hold circuits can be employed in many applications where an interfacing between a particular type of signal to a representative analog voltage is required. For instance, it may be desired to sample a time varying signal generated by a particular system to provide a signal proportional thereto for utilization in adjusting a particular parameter of the system in a closed loop manner.

One example of an application in which a sample and hold circuit may be useful is a fuel metering system for controlling the fuel/air mixture ratio in accordance with the rotational speed of an internal combustion engine. The engine can generate a time varying signal which is utilized to provide a signal having a peak amplitude proportional to the rotational speed of the engine. By sampling this signal an analog voltage can be provided which in turn can be used to control the fuel/air mixture ratio. Thus, a correct mixture ratio can be supplied for more efficiently controlling the operation of the engine.

Thus, it is an object of the present invention to provide an improved sample and hold circuit suitable for fabrication in monolithic integrated circuit form.

SUMMARY OF THE INVENTION

In accordance with the foregoing there is provided a sample and hold circuit producing an output voltage having a magnitude of which is representative of the peak magnitude of a sampled input signal. The sample and hold circuit comprises a unity gain amplifier which is responsive to the applied input signal for producing current at a high impedance output for charging a charge storage device whenever the magnitude of the input signal is greater than the magnitude of the charge developed across the charge storage device. A discharging circuit is also coupled to the charge storage device which discharges the device if the magnitude of the charge developed across the device is greater than the magnitude of the input signal during a predetermined interval.

BRIEF DESCRIPTION OF THE DRAWINGS

The single FIGURE illustrates in schematic form embodiment of the present invention.

DETAILED DESCRIPTION OF THE PREFERRED EMBODIMENT

The single FIGURE illustrates sample and hold circuit 10, within the dashed outline, which is suitable for fabrication in integrated circuit form. Sample and hold circuit 10 includes unity gain amplifier 12 which receives an input signal supplied at input terminal 14. A charge storage device, which in the preferred embodiment comprises capacitor C, is connected to sample and hold circuit 10 at terminal 16. As can be appreciated, capacitor C is an external capacitor and of sufficient value to provide the dominant pole for the aforedescribed system. Hence, the stability of the amplifier is controlled by this external component.

The operation of unity gain amplifier 12 is fully described in an application entitled, "Unity Gain Amplifier For Sourcing Current to a Capacitive Load or the Like", Ser. No. 967,824, U.S. Pat. No. 4,219,782 which is assigned to Motorola, Inc. Unity gain amplifier 12 includes an input differential operational amplifier comprising NPN transistors 18 and 20. The emitter electrodes of these transistors are coupled to respective emitter electrodes of PNP transistors 22 and 24 and therethrough to current source 26. The collector electrodes of transistor 18 and 20 are returned to a source of operating potential V+ through current mirror circuit 28. The base electrodes of transistors 18 and 20 form the differential inputs of the amplifier and are coupled respectively to input terminal 14 and terminal 16. The output of the differential amplifier is returned to the input thereof (the base of transistor 20) through cascoded connected transistors 30 and 32 such that the overall gain of the differential operational amplifier is unity. Hence, the magnitude of the input signal supplied at terminal 14 appears at terminal 16.

Current mirror circuit 28 comprising PNP lateral transistor 34 and vertical transistor 36 provides an intermediate load to the differential amplifier. When transistor 18 is rendered conductive by an appropriate input signal applied at terminal 14 substantially equal currents are supplied from multi-collector transistor 34 to the collectors of transistors 18 and 20. Moreover, base drive current is supplied from transistor 34 to the base of transistor 30 rendering it conductive. NPN transistor 30 being connected in cascode to PNP transistor 32 renders it conductive and current is sourced from the collector of transistor 32 to terminal 16. The current sourced to terminal 16 provides feedback to the second input of the differential input amplifier and also sources current to capacitor C. By feeding back a portion of the output current produced at the collector of transistor 32 to the base electrode of transistor 20 the voltage differential between the base electrodes of transistors 18 and 20 is substantially kept equal. Hence, the magnitude of the input signal appears at output terminal 16. Transistor 32, being connected in a common base configuration, has good frequency response with very little phase shift therethrough and presents a high impedance output looking into terminal 16. Thus, the current sourced to capacitor C is from a high impedance source. To minimize the phase shift through transistor 32 its base electrode is biased at a predetermined voltage level.

In the preferred embodiment, the base electrode of transistor 32 is referenced to a voltage equal to three base-to-emitter voltage drops (3∅) below the value of the operating potential V+. This is accomplished through the resistive voltage divider comprising resistors 38, 40 and 42. By making the value of resistor 38 twice the value of resistor 40 the voltage developed across resistor 40 will be equal to 1∅ which is equal to the voltage to emitter voltage drop across the emitter 43b of transistor 43. Because the current through resistor 38 is equal to the current through resistor 40 and resistor 42, the voltage drop across the former is equal to 2∅. Thus, the voltage at the junction node between resistor 40 and 42 is 3∅ below the value of V+. One reason for having the aforedescribed biasing arrangement is that transistor 43, which has one of its collector-emitter (43b) paths connected between V+ and the base of transistor 32 and a second emitter electrode 43a connected to the collector of transistor 20 and its base electrode reference to 2∅ below V+, supplies the difference current demanded by transistor 20 when the magnitude of the voltage across capacitor C is greater than the magnitude of the input signal which cannot be supplied by transistor 34. Thus, transistor 43a prevents transistor 20 from becoming saturated during the aforedescribed condition. By keeping transistor 20 in an active state, a high impedance output is presented to the capacitive load. Furthermore, when the magnitude of the input signal is greater than the magnitude of the voltage developed across capacitor C transistor 43a is reversed biased.

Sample and hold circuit 10 further includes a discharging circuit for discharging capacitor C whenever the magnitude of the input signal is less than the magnitude of the voltage developed across the capacitor. Discharge of capacitor C is provided through the cascoded connection of transistors 44 and 46 which are coupled between terminal 16 and a ground reference potential. The base electrode of transistor 44 is coupled to a reference potential $V_{REF}$. The base electrode of transistor 46 is connected to one collector electrode of multi-collector transistor 24 and to the collector of transistor 48 which in conjunction with diode 50 forms a differential to single ended output from the differential amplifier comprising transistors 22 and 24, as is known in the art. Diode 50 having its anode connected to one of the collector electrodes of multi-collector transistor 22 and to the base of transistor 48 may be formed by utilizing a transistor having its base electrode connected to its collector electrode as it understood. In operation, if the emitter areas of diode 50 and transistor 48 are equal, equal currents are established therethrough. Hence, as long as the magnitude of the voltage across capacitor C is equal to the magnitude of the input signal the current through diode 50 and the current through transistor 48 will be equal and no excess base drive current is provided to transistor 46. When the magnitude of the voltage across capacitor C is greater than the magnitude of the input signal supplied to transistor 18, transistor 24 conducts more heavily than transistor 22 which produces greater current at its output. Because the current in transistor 48 must be equal to the current in diode 50, the excess current which is developed provides base current drive to transistor 46. Transistor 46 is then rendered conductive which in turn renders transistor 44 conductive to discharge capacitor C until the voltage thereacross is of equal magnitude with that of the input signal.

As shown, the base electrode of transistor 46 is also coupled to a terminal at which a logic control input signal may be applied. Thus, by holding the base of transistor 46 at a logic "0" at all times other than a predetermined interval capacitor C cannot be discharged. This might be desirable if the sample and hold circuit is provided in a control system wherein the input signal at terminal 14 can be varying in magnitude above and below the magnitude of the voltage developed across capacitor C and it is only desired to sample the peak magnitude of the input signal at a predetermined time. Hence, the logic control input signal would be clocked to a logic "1" at the time the input signal is to be sampled thereby allowing discharge of capacitor C if the magnitude developed thereacross was greater than that of the input signal. It should be understood that the logic control input signal could be derived from integrated injection logic (I²L) open collector output circuitry.

In no way limiting the scope of the present invention, sample and hold circuit 10 may be utilized in a system for converting frequency to voltage as disclosed in the application entitled "Frequency to Voltage Converter", Ser. No. 967,828 U.S. Pat. No. 4,222,095 which is assigned to Motorola, Inc. As disclosed therein, a dual ramp voltage is produced having a peak magnitude which is proportional to the frequency of a supplied signal. In the present application, this dual ramp voltage signal can be utilized to drive sample and hold circuit 10 at terminal 14. Thus, if the logic control input signal is caused to go high at the peak of the dual ramp signal applied at terminal 14 capacitor C can be either charged or discharged by sample and hold circuit 10. An I²L D type flip-flop may be used which is responsive to an input for producing the logic control input signal.

The differential to single ended circuit comprising diode 52 and transistor 54, which are connected to respective collector electrodes of transistor 24 and 22, is utilized to provide a logic control output signal when the magnitude of the voltage developed across capacitor C is within a predetermined range of the magnitude of the input signal supplied at terminal 14. The logic control output signal may then be utilized to provide a reset signal for causing the logic control input signal applied to the base of transistor 46 to go to a logic "0" until the next sample pulse is generated. This is accomplished by making the anode area of diode 52 larger than the emitter area of transistor 54 whereby switching of transistor 54 occurs when the collector current provided to diode 52 is greater than the collector current provided to transistor 54 by a predetermined amount. This condition occurs when the magnitude of the voltage developed across capacitor C is a predetermined amount greater than the magnitude of the input signal at terminal 14. The logic control output signal may be used to drive a RS flip-flop which resets the aforementioned D type flip-flop.

Hence, as long as the voltage at terminal 16 is greater than a predetermined amount of the magnitude of the voltage at terminal 14 transistor 54 is rendered conductive to provide a logic "0" at the collector electrode thereof. However as the value of the voltage at terminal 16 comes within the aforementioned predetermined range, transistor 54 is rendered nonconductive and a logic "1" is developed at the collector electrode thereof. The logic control output signal developed at the collector electrode 54 may then be utilized to trigger the logic circuitry producing the logic control input signal to sample and hold circuit 10 as aforedescribed.

What has been described above then is a sample and hold circuit useful for sampling the peak magnitude of an input signal and for providing an output voltage having a magnitude equal to the peak magnitude of the sample input signal.

I claim:
1. Sample and hold circuit comprising:
   charge storage means;
   unity gain amplifier means having first, second inputs and an output, said output being coupled both to second input and to said charge storage means, said unit gain amplifier means being responsive to an input signal being applied to said first input for producing an output signal at said output having a magnitude substantially equal to the magnitude of said input signal such that said charge storage means is charged to the magnitude of said output signal;

discharging circuit means coupled with said unity gain amplifier means to said charge storage means for discharging said charge storage means when said magnitude of the signal developed across said charge storage means is greater than said magnitude of said input signal such that said signal developed across said charge storage means becomes substantially equal to the magnitude of said input signal; and said unity gain amplifier means including
 a. power supply conductor means adapted to be connected to a source of operating potential;
 b. a differential amplifier having first and second inputs and first and second outputs, the input signal being applied to said first input, said second input being coupled to said second input of said unity gain amplifier means;
 c. current mirror circuit means coupled between said first and second outputs of said differential amplifier and said power supply conductor means for providing substantially equal currents thereto in response to said input signal exceeding the magnitude of said signal appearing across said charge storage means; and
 d. cascoded circuit means coupled between said second output and said second input of said differential amplifier.

2. The sample and hold circuit of claim 1 wherein said output circuit means includes:

first electron control means having first, second and control electrodes, said control electrode being coupled to said second output of said differential amplifier, said second electrode being coupled to said power supply conductor means; and second electron control means having first, second and control electrodes, said control electrode being coupled to a bias reference means, said first electrode being coupled to said first electrode of said first electron control means, said second electrode being coupled to said output of said unity gain amplifier.

3. The sample and hold circuit of claim 2 wherein said bias reference means includes:

third electron control means having first, second, third and control electrodes, said first electrode being coupled to said control electrode of said second electron control means, said second electrode being coupled to said second output of said differential amplifier, said third electrode being coupled to said power supply conductor means; and resistive divider means coupled between said power supply conductor means and an output terminal at which is supplied a ground reference potential, said resistor divider having first and second junction terminals which are coupled respectively to said control and first electrodes of said third electron control means such that a predetermined bias potential is produced at said control electrode of said second electron control means.

4. The sample and hold circuit of claim 1 wherein said discharging circuit means includes:

current producing means coupled to said differential amplifier having two branches for communicating currents to respective first and second loads coupled with each branch; and circuit means coupled between said charge storage means and a ground reference potential and having an input coupled to said first load, said circuit means being responsive to the current in the first one of said branches being greater than the current in the second one of said branches for discharging said charge storage means.

5. The sample and hold circuit of claim 4 wherein each of said first and second loads comprises a current mirroring circuit having inputs coupled to each branch and a terminal connected to said ground reference potential.

6. A monolithic integrated sample and hold circuit comprising:

a unity gain amplifier having a first input terminal to which is supplied an input signal, a second input terminal and an output terminal, said output terminal being coupled both to a charge storage device and to said second input terminal such that the magnitude of the output signal appearing at said output terminal is substantially equal to the magnitude of said input signal wherein said unity gain amplifier produces current for charging the charge storage device whenever the magnitude of the input signal is greater than the magnitude of the signal appearing across the charge storage device;

discharging circuit means coupled with said unity gain amplifier to the charge storage device for discharging the charge storage device when the magnitude of the signal appearing thereacross is greater than the input signal; and said unity gain amplifier including
 a. power supply conductor means adapted to be connected to a source of operating potential;
 b. a differential amplifier having first and second inputs and first and second outputs, the input signal being applied to said first input said second input being coupled to said second input terminal of said unity gain amplifier;
 c. current mirror circuit means coupled between said first and second outputs of said differential amplifier and said power supply conductor means for providing substantially equal currents thereto; and
 d. cascoded circuit means coupled between said second output and said second input of said differential amplifier, said output circuit means being coupled with said second input of said differential amplifier to said output of said unity gain amplifier.

7. The sample and hold circuit of claim 6 wherein said output circuit means includes:

first electron contron means having first, second and control electrodes, said control electrode being coupled to said second output of said differential amplifier, said second electrode being coupled to said power supply conductor means; and second electron control means having first, second and control electrodes, said control electrode being coupled to a bias reference means, said first electrode being coupled to said first electrode of said first electron control means, said second electrode being coupled to said output of said unity gain amplifier.

8. The sample and hold circuit of claim 7 wherein said bias reference means includes:

third electron control means having first, second, third and control electrodes, said first electrode being coupled to said control electrode of said second electron control means, said second electrode being coupled to said second output of said differential amplifier, said third electrode being coupled to said power supply conductor means; and resistive divider means coupled between said power supply conductor means and an output terminal at which is supplied a ground reference potential, said resistor divider having first and second junction terminals which are coupled respectively to said control and first electrodes of said third electron control means such that a predetermined bias potential is produced at said control electrode of said second electron control means.

9. The sample and hold circuit of claim 8 wherein said discharging circuit means includes:

current producing means coupled to said differential amplifier having two branches for communicating current to respective first and second loads coupled with each branch; and circuit means coupled between said charge storage means and a ground reference potential and having an input coupled to said first load, said circuit means being responsive to the current in the first one of said branches being greater than the current in the second one of said branches for discharging said charge storage means.

10. The sample and hold circuit of claim 9 wherein each of said first and second loads comprises a current mirroring circuit having inputs coupled to each branch and a terminal connected to said ground reference potential.

11. The sample and hold circuit of claim 10 wherein said circuit means for discharging the charge storage device includes:

electron control means having first, second and control electrodes, the second electrode being coupled to said output terminal of the unity gain amplifier, said control electrode being coupled to a source of bias potential; and additional electron control means having first, second and control electrodes, said first electrode being coupled to said terminal at which is provided a ground reference potential, said second electrode being coupled to said first electrode of said electron control means of said circuit means and said control electrode being coupled to said input of said circuit means.

12. The sample and hold circuit of claim 11 including conductor means coupled to said control electrode of said additional electron control means being adapted to receive logic control signals so that discharging of the charge storage device occurs only during a predetermined interval.

* * * * *